United States Patent [19]
Kang et al.

[11] Patent Number: 6,040,715
[45] Date of Patent: Mar. 21, 2000

[54] OUTPUT BUFFER CONTROL CIRCUIT THAT PERFORMS HIGH SPEED OPERATION BY GENERATING A PREDETERMINED WIDTH OF A PULSE BASED ON AN OUTPUT CONTROL SIGNAL

[75] Inventors: Hee-Bok Kang, Daejeon; Dae-Hui Kim, Kyungki-Do, both of Rep. of Korea

[73] Assignee: LG Semicon Co., Ltd., Cheongju, Rep. of Korea

[21] Appl. No.: 08/893,613

[22] Filed: Jul. 11, 1997

[30] Foreign Application Priority Data

Jul. 12, 1996 [KR] Rep. of Korea .................. 96/28129

[51] Int. Cl.[7] .................. H03K 19/0175; H03K 19/094
[52] U.S. Cl. .................. 326/87; 326/83; 326/17
[58] Field of Search .................. 326/87, 17, 83, 326/86, 57, 58, 121

[56] References Cited

U.S. PATENT DOCUMENTS

| | | | |
|---|---|---|---|
| 5,268,868 | 12/1993 | Kajigaya et al. | 365/206 |
| 5,300,835 | 4/1994 | Assar et al. | 326/68 |
| 5,424,983 | 6/1995 | Wojcicki et al. | 365/189.05 |

*Primary Examiner*—Michael Tokar
*Assistant Examiner*—Daniel D. Chang
*Attorney, Agent, or Firm*—Fleshner & Kim

[57] ABSTRACT

An output buffer control circuit is provided in which a three-phase (state) level of an output warning can be realized in a short time, which results in increasing the processing speed. The output buffer control circuit uses a predetermined width pulse at the point when the output control signal is changed to low level. The predetermined width pulse is operated with the previous output signal and the resultant signal feeds back to the output terminal. The output buffer control circuit includes a first data latch unit for inverting and latching input data when a latch signal is high level, a data output unit for logically operating an output signal from the first data latch unit based on an output control signal and generating an output data, a second data latch unit for inverting and latching the output signal from the first data latch unit when the output control signal is high level, a signal detector for generating a predetermined width pulse at the point when the output control signal is shifted to low level, and an output terminal pre-reset unit for logically operating the pulse outputted from the signal detector and the output signal from the second data latch unit to pre-reset the output terminal of the data output unit.

16 Claims, 5 Drawing Sheets

FIG. 4A  ODE

FIG. 4B  DI

FIG. 4C  DOLAT

FIG. 4D  OUTPUT OF IN19

FIG. 4E  DOUT

FIG. 5

OUTPUT BUFFER CONTROL CIRCUIT THAT PERFORMS HIGH SPEED OPERATION BY GENERATING A PREDETERMINED WIDTH OF A PULSE BASED ON AN OUTPUT CONTROL SIGNAL

BACKGROUND OF THE INVENTION

1. Field of the Invention

The present invention relates to an output buffer control circuit, and in particular, to an output buffer control circuit that performs high speed operation by generating a predetermined width of a pulse based on an output control signal.

2. Background of the Related Art

Figure 1:
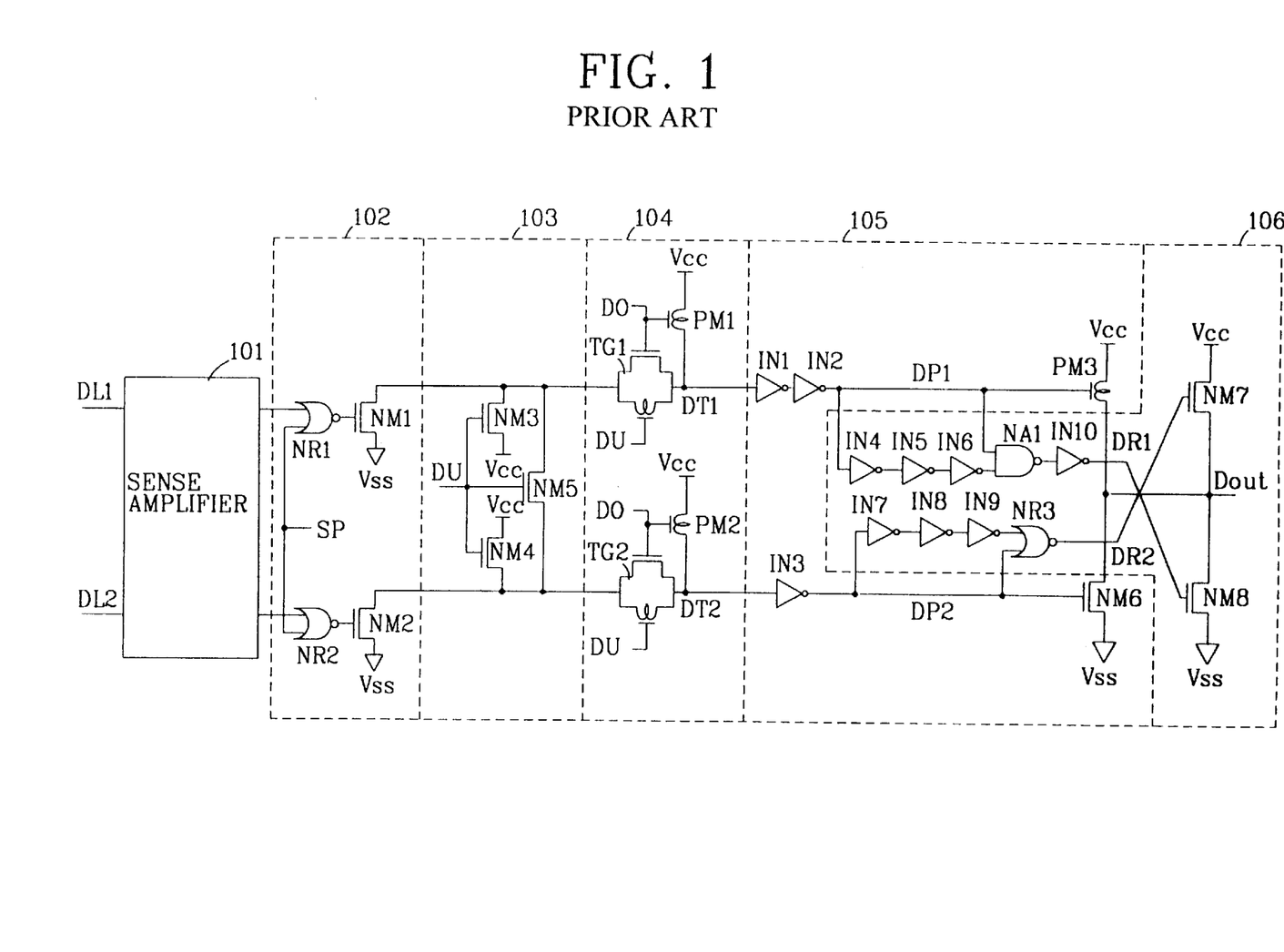
FIG. 1 is a diagram showing an output buffer circuit according to the related art.

As shown in FIG. 1, a related art output buffer control circuit includes a data bus driving unit 102, a data bus equalizer 103, a data transmitter 104, a data output unit 105 and an output terminal pre-reset unit 106. The sense amplifier 101 detects data (DL1, DL2) of a cell (not shown). The data bus driving unit 102 drives data buses (DB1, DB2) based on first and second output signals received from the sense amplifier 101 when a sense amplifier enable signal (SP) becomes low level. The data bus equalizer 103 equalizes the data buses (DB1, DB2). The data transmitter 104 transmits data loaded on the data buses (DB1, DB2) when output enable signals (DU, DO) become low level and high level, respectively. The data output unit 105 generates an output signal via an output terminal (DOUT) based on the data transmitted from the data transmitter 104. The output terminal pre-reset unit 106 pre-resets the output terminal (DOUT) by delaying for a predetermined time and then logically processing the data transmitted from the data transmitter 104.

The data bus driving unit 102 includes NOR gates (NR1, NR2) for NORing the sense amplifier enable signal with the first and second output signals from the sense amplifier 101, respectively. The data bus driving unit 102 also includes NMOS transistors (NM1, NM2) that turn on or off based on the respective output signals from the NOR gates (NR1, NR2). The NMOS transistors (NM1, NM2), respectively, drive the data buses (DB1, DB2).

The data bus equalizer 103 includes NMOS transistors (NM3–NM5), whose gates receive an output enable signal (DU). The NMOS transistors (NM3, NM4) are connected to the data buses (DB1, DB2), respectively, and their drains receive a voltage (Vcc). The NMOS transistor (NM5) is connected between the data buses (DB1, DB2).

In the data transmitter 104, the output enable signal (DU) is applied to the inverting control terminal of transmission gates (TG1, TG2). The transmission gates (TG1, TG2) are coupled to the data buses (DB1, DB2), respectively. Sources of PMOS transistors (PM1, PM2) receive the voltage (Vcc). Gates of the PMOS transistors (PM1, PM2) and control terminals of the transmission gates (TG1, TG2) receive an output enable signal (DO). Drains of the PMOS transistors (PM1, PM2) are respectively coupled to output terminals of the transmission gates (TG1, TG2) at the data buses (DB1, DB2).

In the data output unit 105, a first output signal from the data transmitter 104 is applied through series inverters (IN1, IN2) to a PMOS transistor (PM3) gate while its source receives the voltage (Vcc). A second output signal from the data transmitter 104 is applied through an inverter (IN3) to an NMOS transistor (NM6) gate while its source is grounded. Drains of the PMOS transistor (PM3) and the NMOS transistor (NM6) are commonly connected to the output terminal (DOUT).

The output terminal pre-reset unit 106 includes a plurality of series inverters (IN4–IN6) and (IN7–IN9) for sequentially delaying respective terminal signals (DP1, DP2) from the data output unit 105. The output terminal pre-reset unit 106 further includes a NAND gate (NA1) for NANDing the terminal signal (DP1) and an output signal from the inverter (IN6), an inverter (IN10) for inverting an output signal from the NAND gate (NA1), a NOR gate (NR3) for NORing the terminal signal (DP2) and an output signal from the inverter (IN9), an NMOS transistor (NM7) for applying a voltage (Vcc) to the output terminal (DOUTf when an output signal from the NOR gate (NR3) is high level and an NMOS transistor (NM8) for grounding the output terminal (DOUT) when an output signal from the inverter (IN10) is high level.

Operations of the related art output buffer control circuit will now be described.

Figure 2A:
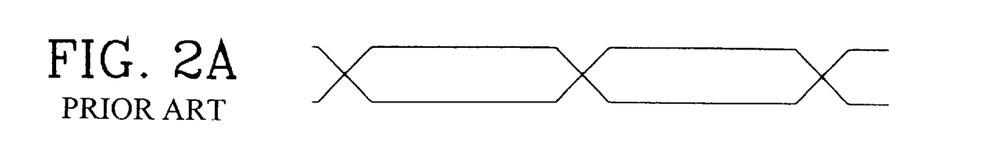
FIGS. 2A–2F are diagrams showing various timings of the circuit in FIG. 1.
Figure 2B:
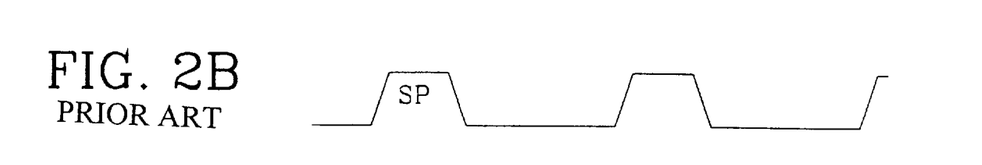

In the operation of a memory device, when a low level of data (DL1) is input to the sense amplifier 101, the NMOS transistor (NM1) is turned on because the NOR gate (NR1) NORs a low level of the sense amplifier enable signal (SP) and a low level of the first output signal from the sense amplifier 101. The data (DL1, DL2) and the sense amplifier enable signal (SP) are shown in FIGS. 2A–2B. Further, the NMOS transistor (NM2) is turned off because the NOR gate (NR2) NORs the low sense amplifier enable signal (SP) and a high level of the second output signal from the sense amplifier 101.

Then, in the data bus equalizer 103, the data bus (DB1) becomes low level with the NMOS transistor (NM1) turned on, and the data bus (DB2) becomes high level with the NMOS transistor (NM2) turned off.

Accordingly, in the data transmitter 104 because the output enable signals (DU, DO) become low and high level, respectively, output signals from the data bus equalizer 103 are outputted to the data output unit 105 through the transmission gates TG1, TG2).

Next, in the data output unit 105, the terminal signal (DP1) becomes low level through the inverters (IN1, IN2) in accordance with the low level of the first output signal output by the data transmitter 104. Further, the terminal signal (DP2) becomes low level through the inverter (IN3) in accordance with the high level of the second output signal output by from the data transmitter 104.

Therefore, only the PMOS transistor (PM3) is turned on in the data output unit 105 and the output terminal (DOUT) becomes high level.

Figure 2C:
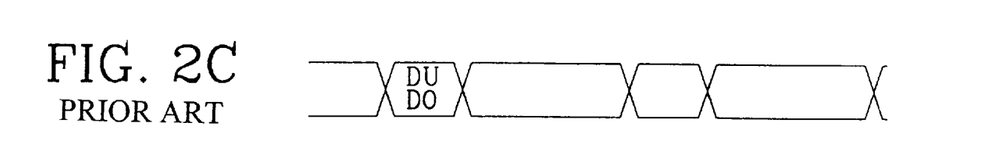
Figure 2D:
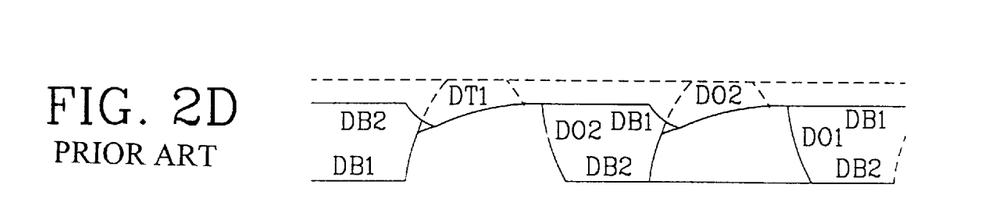
Figure 2E:
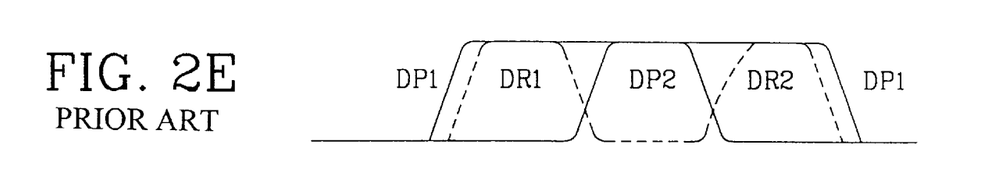
Figure 2F:
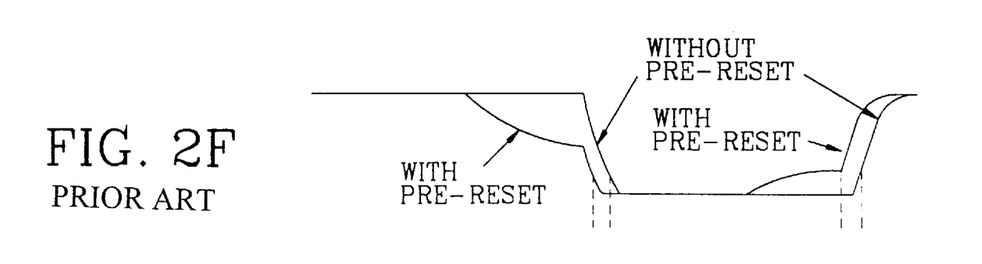

When the data (DL1) is changed from low level to high level, while the sense amplifier enable signal (SP) is high level, in the data bus driving unit 102 the output signals from the NOR gates (NR1, NR2) become low level to keep the NMOS transistors (NM1, NM2) turned off. Then, the output enable signals (DU, DO) shown in FIG. 2C, become high and low level, respectively, to disable the transmission gates (TG1, TG2) in the data transmitter 104.

In the data bus equalizer 103, the NMOS transistors (NM3 (NM5) are turned on in accordance with the high level of the output enable signal (DU) to equalize the high level data buses (DB1, DB2). In the data transmitter 104, the PMOS transistors (PM1, PM2) are turned on in accordance with the low level of the output enable signal (DO) to output the voltage (Vcc) to the data output unit (105).

Next, in the data output unit 105, the terminal signals (DP1, DP2) become high and low level, respectively, through the inverters (IN1–IN3) in accordance with the voltage (Vcc) output by the data transmitter 104. As a result, the PMOS transistor (PM3) and the NMOS transistor (NM6)

are kept turned off to keep the output terminal (DOUT) at the previous high level.

Then, during the delay time of the inverters (IN4–IN9) in the output terminal pre-reset unit 106, the NAND gate (NA1) NANDs the high level of the terminal signal (DP1) and a high level of an output signal from the inverter (IN6). The inverter (IN10) inverts the NANDed signal to high level to turn on the NMOS transistor (NM8). During the delay time, the NOR gate (NR3) NORs the low level of the terminal signal (DP2) and a high level of an output signal from the inverter (IN9) to keep the NMOS transistor (NM7) off.

Therefore, with the NMOS transistor (NM8) turned on, the level of the output terminal (DOUT) is lowered to a three-phase (state) level.

After the delay time of the inverters (IN4–IN9) elapses, the output signal from the NAND gate (NA1) becomes high level. Subsequently, the DR1 signal becomes low level through the inverter (IN1). As a result, the NMOS transistor (NM8) is turned off. After the delay time, the output signal from the NOR gate (NR3) is maintained as low level, and consequently, the NMOS transistor (NM7) is kept off.

Next, when the sense amplifier enable signal (SP) becomes low level and the output enable signals (DU, DO) become low and high level, respectively, the output signals from the NOR gates (NR1, NR2) become low and high level, respectively. In this manner, the NMOS transistor (NM1) is kept off and the NMOS transistor (NM2) is turned on.

Thus, the data bus (DB1) is kept high level and the data bus (DB2) becomes low level in the data bus equalizer 103, and the high and low levels of the respective data buses (DB1, DB2) are output to the data output unit 105 through the transmission gates (TG1, TG2).

Accordingly, in the data output unit 105, the terminal signal (DP1) becomes high level through the inverters (IN1, IN2), and the terminal signal (DP2) becomes high level through the inverter (IN3). In the data output unit 105, only the NMOS transistor (NM6) is turned on to obtain a low level at the output terminal (DOUT).

Then, the data (DL1) detected from the sense amplifier 101 is changed from high level to low level. In this manner, during the delay time of the inverters (IN4–IN9) in the pre-reset unit 106, an output signal from the NAND gate (NA1) becomes high level. As a result, an output signal from the inverter (IN10) becomes low level to turn off the NMOS transistor (NM8). An output signal from the NOR gate (NR3) becomes high level to turn on the NMOS transistor (NM7), As a result, the output terminal (DOUT) is raised to a three-phase (state) level.

Then, when the sense amplifier enable signal (SP) becomes low level and the output enable signals (DU, DO) become low and high level, respectively, the data DL1, DL2 detected from the sense amplifier 101 are input to the data bus driving unit 102. The data (DL1, DL2) sequentially pass through the data bus equalizer 103 and the data transmitter 104, and are input to the data output unit 105, Consequently, the PMOS transistor (PM3) alone is turned on, and the output terminal (DOUT) becomes high level.

The above-described operation is carried out as shown in the timing diagrams in FIGS. 2A–2F.

However, the related art output buffer control circuit has various disadvantages in that an erroneous operation is caused or the operation speed is slowed down because the output voltage cannot assume a three-phase (state) level when a pulse width narrows according to an address transition detection.

In particular, because the pulse width, according to the address transition detection, cannot be made wider in a high speed memory device other methods are required. Thus, a need exists for a high speed output buffer control circuit.

SUMMARY OF THE INVENTION

An object of the present invention is to substantially obviate one or more of the problems caused by limitations and disadvantages of the related art.

Another object of the present invention is to provide an output buffer control circuit that realizes a three-phase (state) output terminal and increases an operational speed.

Another object of the present invention is to provide an output buffer control circuit that realizes a three-phase (state) output terminal and increases an operational speed.

A further object of the present invention is to provide an output buffer control circuit that realizes a three-phase (state) output terminal although a pulse width of an output control signal according to an address transition detection becomes narrow.

A further object of the present invention is to provide a high speed output buffer control circuit by generating a predetermined width of a pulse when the output control signal becomes active from high level to low level and operating the predetermined width pulse with a previous output data and then feeding-back the resultant signal to the output terminal.

Such objects, features and advantages may be achieved at least in part or in whole by an improved output buffer control circuit that includes a first data latch unit for inverting and latching an input data when a latch signal is high level, a data output unit for logically operating an output signal from the data latch unit in accordance with an output control signal and generating an output data, a second data latch unit for inverting and latching the output signal from the first data latch unit when the output control signal is a high level, a signal detector for generating a predetermined width pulse at a point when the output control signal is shifted to a low level, and an output terminal pre-reset unit for logically operating the pulse outputted from the signal detector and the output signal from the second data latch unit to pre-reset the output terminal of the data output unit.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 3:
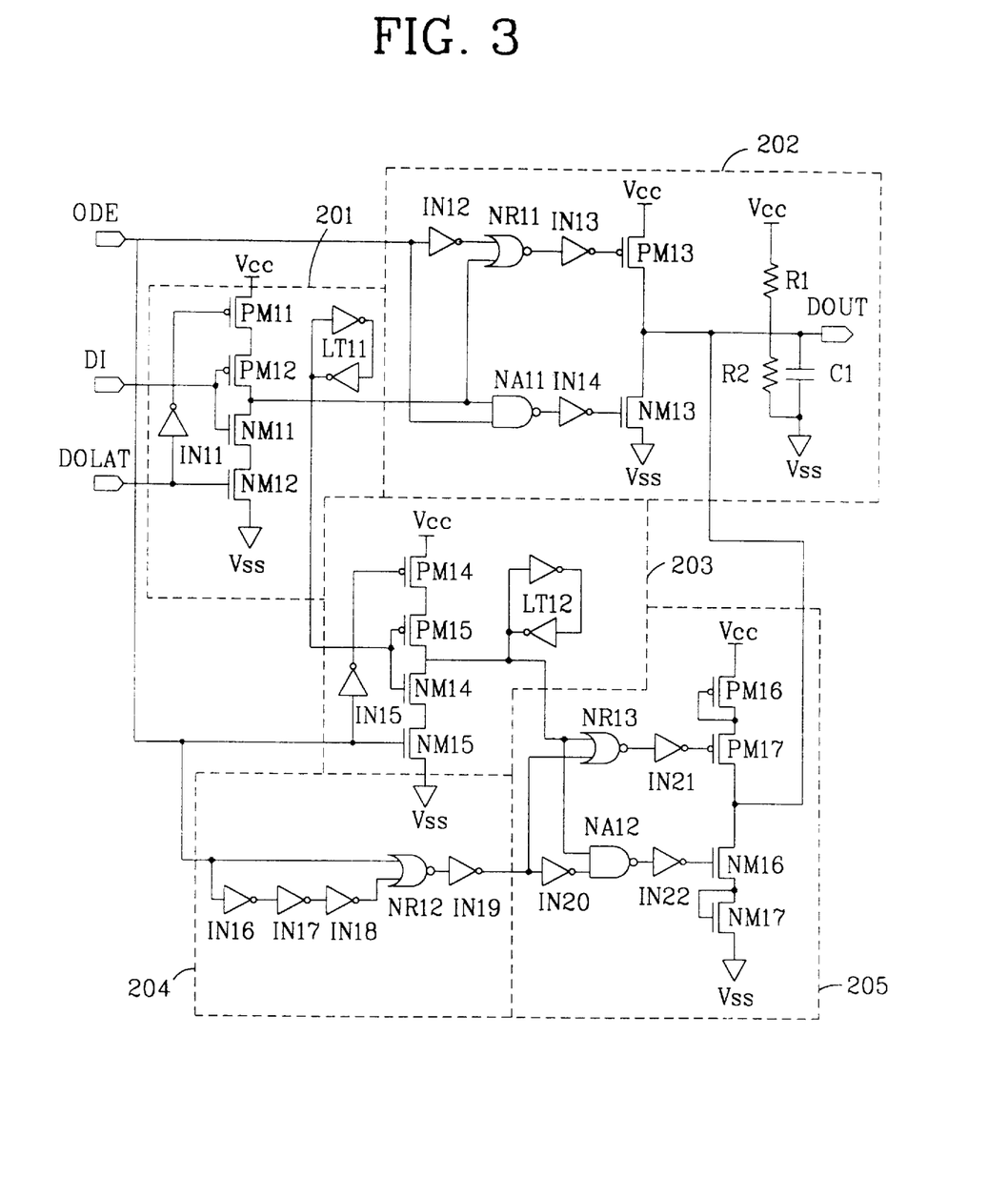
FIG. 3 is a diagram showing an output buffer control circuit according to an embodiment of the present invention.

FIG. 3 shows a circuit diagram of a preferred embodiment of an output buffer control circuit according to the present invention. The output buffer circuit includes a first data latch unit 201, a data output unit 202, a second data latch unit 203, a signal detector 204 and an output terminal pre-reset unit 205. The first data latch unit 201 inverts and latches an input data (Di) when a latch signal (DOLAT) is high level. The data output unit 202 logically processes an output signal from the data latch unit 201 in accordance with an output control signal (ODE) and generates an output data at an output terminal (DOUT). The second data latch unit 203 inverts and latches an output signal from the first data latch unit 201 when the output control signal (ODE) is high. The signal detector 204 generates and outputs a predetermined width pulse at a point when the output control signal (ODE) is shifted from a high level to a low level. The output terminal pre-reset unit 205 logically processes the outputted pulse from the signal detector 204 and an output signal from the second data latch unit 203 to pre-reset the output terminal (DOUT) of the data output unit 202.

In the first data latch unit 201, the latch signal (DOLAT) is applied to a gate of an NMOS transistor (NM12) having a grounded source and through an inverter (IN11) to the gate of a PMOS transistor (PM11) having a source receiving a voltage (Vcc), the input data (Di) is applied to a gate of a PMOS transistor (PM12) having a source coupled to a drain of the PMOS transistor (PM11). The input data (D1) is also applied to a gate of an NMOS transistor (NM11) having a source coupled to a drain of the NMOS transistor (NM11), the drains of the PMOS transistor (PM12) and the NMOS transistor (NM11) are commonly coupled to a latch (LT11) and the latched data is output from this coupling point.

The second data latch unit 203 has an identical construction to the first data latch unit 201 and latches an output signal from the first data latch unit 201, the second data latch unit includes an inverter (IN15), PMOS transistors (PM14, PM15), NMOS transistors (NM14, NM15) and a latch (LT12).

In the data output unit 202, the output control signal (ODE) is commonly applied to one input terminal of a NAND gate (NA11) and through an inverter (IN12) to one input terminal of a NOR gate (NR11). The output signal from the first data latch unit 201 is commonly applied to the other input terminals of the NAND gate (NA11) and the NOR gate (NR11). An output terminal of an inverter (IN13) receiving an output signal from the NOR gate (NR11) is coupled to the gate of a PMOS transistor (PM13). The source of the PMOS transistor (PM13) receives the voltage (Vcc). An output terminal of an inverter (IN14) receiving an output signal from the NAND gate (NA11) is coupled to the gate of the NMOS transistor (NM13). The source of NMOS transistor (NM13) is grounded and the drains of the PMOS transistor (PM13) and the NMOS transistor (NM13) are commonly coupled to the output terminal (DOUT), which generates the output signal. The data output unit further includes resitors R1, R2 and a capacitor C1.

The signal detector 204 includes series inverters (IN16–IN18) for sequentially delaying the output control signal (ODE), a NOR gate (NR12) for NORing an output signal from the inverter (IN18) and the output control signal (ODE), and an inverter (IN19). The inverter (IN19) inverts an output signal from the NOR gate (NR12) and outputs the inverted signal to the output terminal pre-reset unit 205.

In the output terminal pre-reset unit 205, the output signal from the second data latch unit 203 is applied to one input terminal of a NOR gate (NR13) and one input terminal of a NAND gate (NA12). The output signal from the signal detector 204 is applied to the other input terminals of the NOR gate (NR13) and (through an inverter (IN20)) the NAND gate (NA12). The output terminals of the NOR gate (NR13) and the NAND gate (NA12) are respectively coupled to the input terminals of inverters (IN21, IN22). A source of a PMOS transistor (PM16) receives the voltage (Vcc) and its gate and drain are commonly coupled to a source of a PMOS transistor (PM17). The gate of the PMOS transistor (PM17) is connected to the output terminal of the inverter (IN21). An NMOS transistor (NM17) has a grounded source and its gate and drain are commonly coupled to a gate of an NMOS transistor (NM16). The gate of the NMOS transistor (NM16) is coupled to the output terminal of the inverter (IN22). Drains of the PMOS transistor (PM17) and the NMOS transistor (NM16) are commonly coupled to the output terminal (DOUT) of the data output unit 202.

Operations and effects of the preferred embodiment of the output buffer control circuit will now be described.

Figure 4A:
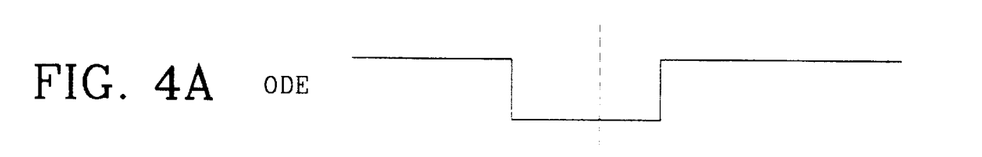
FIGS. 4A–4E are diagrams showing various timings of the circuit in FIG. 3.
Figure 4B:
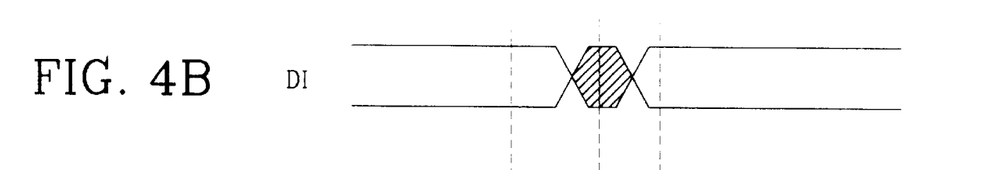
Figure 4C:
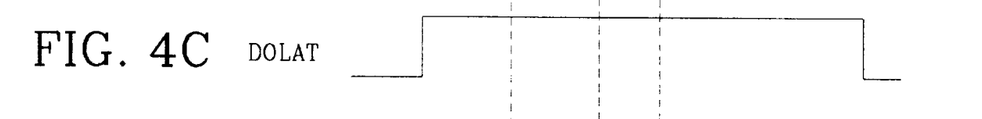

When the latch signal (DOLAT) becomes active from low level to high level in the first data latch unit 201, the PMOS transistor (PM11) and the NMOS transistor (NM12) are turned on and the input data (Di) is inverted through the PMOS transistor (PM12) and the NMOS transistor (NM11). The inverted signal is maintained by the latch (LT11). The latch signal (DOLAT) is shown in FIG. 4C.

In the data output unit 202, the NAND gate (NA11) is enabled and the output enable signal (ODE) is inverted to low level through the inverter (IN12) because the output control signal (ODE) is high level. Thus, the NOR gate (NR11) is enabled. Further, if the input data (Di) is high level and consequently the output signal from the first data latch unit 201 is latched high level, a low level signal is output from the NAND gate (NA11) and inverted in the inverter (IN14) to high level. A low level signal is outputted from the NOR gate (NR11) and inverted by the inverter (IN13) to high level.

Therefore, in the data output unit 202, the output terminal (DOUT) becomes low level with the PMOS transistor (PM13) turned off and the NMOS transistor (NM13) turned on.

If the input data (Di) is low level, the output signal from the first data latch 201 is latched low level. Then, in the data output unit 202, a high level signal is output from the NOR gate (NR11) and inverted to low level in the inverter (IN13). In addition, a high level signal is outputted from the NAND gate (NA11) and inverted to low level in the inverter (IN14).

Therefore, in the data output unit 202, the output terminal (DOUT) becomes high level with the PMOS transistor (PM13) turned on and the NMOS transistor (NM13) turned off.

Here, the second data latch unit 203, the PMOS transistor (PM14) and the NMOS transistor (NM15) are turned on when the output control signal (ODE) is high level. Accordingly, the output signal from the data latch unit 201 is inverted through the PMOS transistor (PM15) and the NMOS transistor (NM14) and the inverted signal is maintained by the latch (LT12).

That is, when the output signal from the first data latch unit 201 is low level, the output signal from the second data latch unit 203 is high level. Similarly, when the output signal from the first data latch unit 201 is high level, the output signal from the second data latch unit 203 is low level.

In the signal detector 204, when the output control signal (ODE) is high level, the output signal from the NOR gate (NR12) is maintained low level. Thus, the output signal from the inverter (IN19) is maintained high level.

Then, in the output terminal pre-reset unit 205, a low level signal is output by the NOR gate (NR13) and consequently a high level signal is output by the inverter (IN21). Further, a high level signal is output by the NAND gate (NA12). As a result, a low level signal is output by the inverter (IN22). Thus, the output terminal pre-reset unit 205, keeps the PMOS transistor (PM17) and the NMOS transistor (NM16) turned off.

Next, the output control signal (ODE) is shifted to low level according to the address transition detection. Accordingly, in the data output unit 202, the inverter (IN12) inverts the output control signal (ODE) to high level, the output signal from the NOR gate (NR11) becomes low level, and the output signal from the inverter (IN13) becomes high level. In addition, the output signal from the NAND gate (NA11) receiving the low level output control signal (ODE) becomes high level, and then inverted to low level by the inverter (IN14).

Therefore, in the data output unit 202, the PMOS transistor (PM13) and the NMOS transistor (NM13) are turned off. As a result, the output terminal (DOUT) maintains the previous output value.

In the second data latch unit 203 when the output control signal (ODE) becomes low level, the PMOS transistor (PM14) and the NMOS transistor (NM15) are turned off. Consequently, the previous value of the latch (LT12) is maintained.

In the signal detector 204, the output signal from the inverter (IN18) is low level when the output control signal (ODE) becomes low level. Thus, a high level signal is output by the NOR gate (NR12). After a predetermined time has elapsed for the shifted low level output control signal (ODE) to pass through the inverters (IN16 (IN18), a high level signal is output by the inverter (IN18) to generate a low level output signal from the NOR gate (NR12).

Figure 4D:
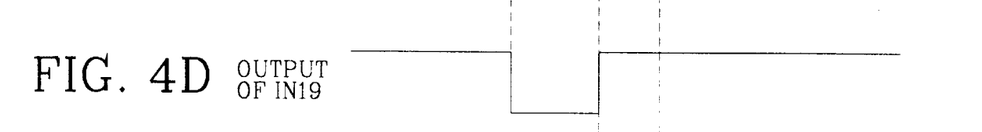
Figure 4E:
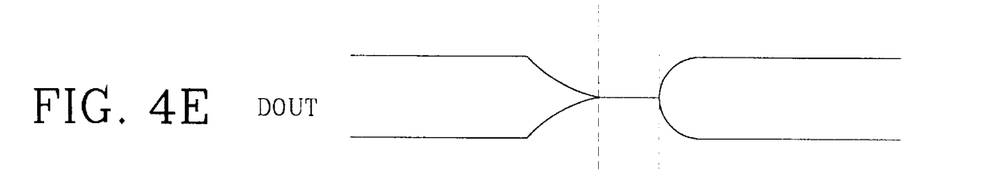

The output signal from the NOR gate (NR12) is inverted in the inverter (IN19). Thus, at the point when the output control signal (ODE) shifts to a low level, an output signal from the signal detector 204 becomes low level, and after a predetermined time elapses, the signal returns to high level. The waveform of the output signal of the inverter (IN19) is shown in FIG. 4D.

Accordingly, in the output terminal pre-reset unit 205, the NOR gate (NR13) and the NAND gate (NA12) are enabled while the output signal from the signal detector 204 is low level.

Therefore, when the input data (Di) is low level and as a result an output signal from the second data latch unit 204 becomes low level, an output signal from the NOR gate (NR13) becomes high level and is inverted to low level by the inverter (IN21). In addition, a high level signal is output from the NAND gate (NA12) and is inverted to low level by the inverter (IN22). As a result, only the PMOS transistor (PM17) is turned on in the output terminal pre-reset unit 205, and the voltage (Vcc) passes sequentially through the PMOS transistors (PM16, PM17) and then is applied to the output terminal (DOUT).

Accordingly, since the output terminal (DOUT) is shifted from low level to high level, a three-phase (state) level can be obtained.

When the input data (Di) is high level and a high level signal is output by the second data latch unit 204, in the output terminal pre-reset unit 205 outputs a low level signal from the NOR gate (NR13), which is inverted to high level by the inverter (IN21). Then, a low level signal is output by the NAND gate (NA12) and inverted to high level through the inverter (IN22). As a result, the NMOS transistor (NM16) alone is turned on in the output terminal pre-reset unit 205 and the output terminal (DOUT) is grounded sequentially through the NMOS transistors (NM16, NM17).

In this manner, a three-phase (state) level can be obtained as the output terminal (DOUT) is shifted from high level to low level.

Figure 5:
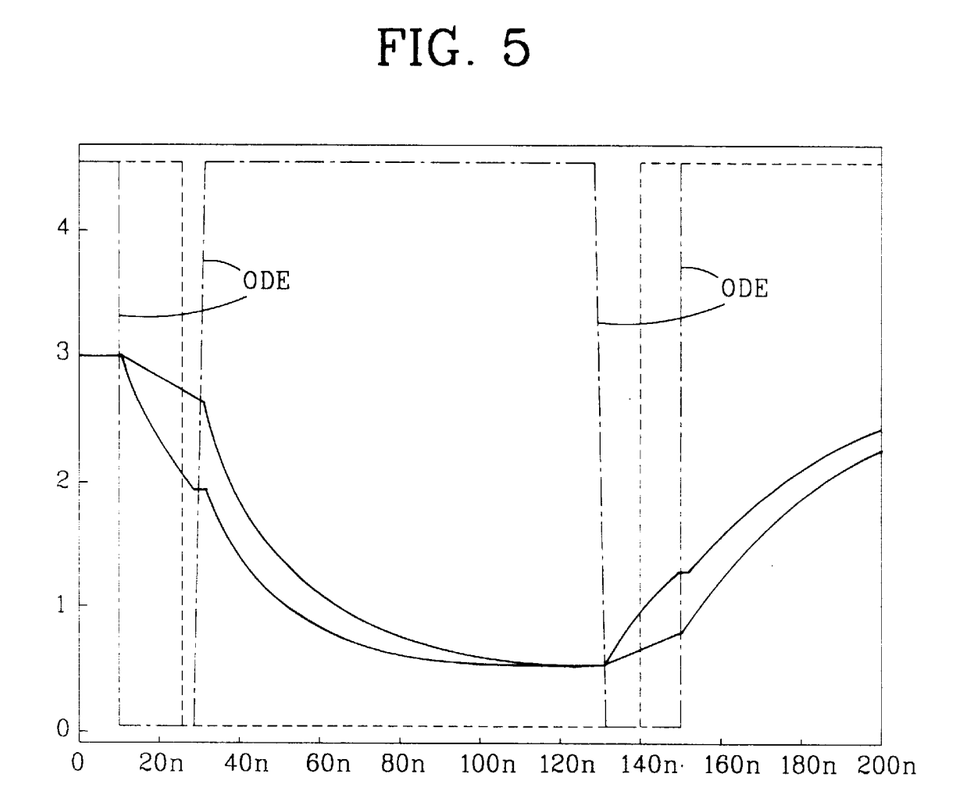
FIG. 5 is a waveform diagram showing a level change of an output terminal of the circuit in FIG. 3.

The above-described operations are performed according to the timing diagrams shown in FIGS. 4A–4E. The level of the output terminal (DOUT), as shown in the waveform diagram in FIG. 5, is sharply changed at the point when the output control signal (ODE) becomes low level to improve the overall processing speed.

As described above, generating a predetermined width pulse at the point when the output control signal changes from high to low level, logically operating the predetermined width pulse with the previous output signal and feeding-back the resultant signal to the output terminal realizes a three-phase (state) level of the output terminal in reduced time. Thus, the processing speed of the first preferred embodiment of the output buffer control circuit is enhanced.

It is to be understood that both the foregoing general description and the following detailed description are exemplary and explanatory. It will be apparent to those skilled in the art that various modifications can be made in the output buffer control circuit of the present invention without departing from the spirit or scope of the invention. It is intended that the present invention cover the modifications and variations of this invention that are within the scope of the appended claims and their equivalents.

What is claimed is:

1. An output buffer control circuit, comprising:
    a first data latch means for inverting and latching an input data based on a first signal;
    a data output means for logically operating an output signal from the first data latch means based on a second signal and generating an output data;
    a second data latch means for inverting and latching the output signal from the first data latch unit based on the second signal;
    a signal detecting means for generating a predetermined width pulse based on the second signal; and
    an output terminal pre-reset unit for logically operating the predetermined width pulse outputted from the signal detecting means and an output signal from the second data latch means to pre-reset the output data of the data output means.

2. The circuit of claim 1, wherein the signal detecting means generates the predetermined width pulse when the second signal shifts from a high level to a low level.

3. The circuit of claim 1, wherein the data output means includes an output terminal to output the output data.

4. The circuit of claim 1, wherein the first signal is a first latch signal and the second signal is an output control signal.

5. The circuit of claim 1, wherein the output data comprises a three phase signal.

6. The circuit of claim 1, wherein in the first data latch means comprises:
    a latch; and four transistors, wherein the first signal is applied to a control electrode of a first transistor having a first electrode that receives a first potential and the inverted first signal is applied to a control electrode of a fourth transistor having a first electrode that receives a second potential, the input data is applied to a control electrode of second and third transistors, wherein the third transistor has a first electrode coupled to a second electrode of the fourth transistor, wherein the second transistor has a first electrode coupled to a second electrode of the first transistor, and wherein the second electrodes of the second and third transistors are commonly coupled to the latch.

7. The circuit of claim 6, wherein the first and second transistors are NMOS transistors, the third and fourth transistors are PMOS transistors, the first electrode, the second electrode and the control electrode are a source, a drain and a gate, respectively, and wherein the first and second potentials are ground and a reference voltage, respectively.

8. The circuit of claim 1, wherein in the second data latch means comprises:
 a latch; and
 four transistors, wherein the first signal is applied to a control electrode of a first transistor having a first electrode that receives a first potential and the inverted first signal is applied to a control electrode of a fourth transistor having a first electrode that receives a second potential, the input data is applied to a control electrode of second and third transistors, wherein the third transistor has a first electrode coupled to a second electrode of the fourth transistor, wherein the second transistor has a first electrode coupled to a second electrode of the first transistor, and wherein the second electrodes of the second and third transistors are commonly coupled to the latch.

9. The circuit of claim 8, wherein the first and second transistors are NMOS transistors, the third and fourth transistors are PMOS transistors, the first electrode, the second electrode and the control electrode are a source, a drain and a gate, respectively, and wherein the first and second potentials are ground and a reference voltage, respectively.

10. The circuit of claim 1, wherein the signal detecting means comprises:
 a delay means for sequentially delaying the second signal; and
 a first logic gate for logically operating an output signal from the delay means and the second signal.

11. The circuit of claim 10, wherein the delay means comprises a plurality of series coupled inverters, the first logic gate is a NOR gate, and wherein an output signal from the NOR gate is inverted and transmitted to the output terminal pre-reset means.

12. The circuit of claim 1, wherein the output terminal pre-reset means comprises:
 a first logic gate having one input terminal receiving an output signal from the second data latch means and another input terminal receiving an output signal from the signal detecting means;
 a second logic gate having one input terminal receiving the output signal from the second data latch means and another input terminal receiving the inverted output signal from the signal detecting means;
 third and fourth logic gates having input terminals respectively coupled to output terminals of the first and second logic gates;
 a first transistor having a first electrode receiving a first potential, and commonly coupled second and control electrodes;
 a second transistor having a control electrode coupled to an output terminal of the third logic gate, a first electrode connected to the second and control electrodes of the first transistor and a second electrode coupled to the data output means;
 a third transistor having a control electrode coupled to an output terminal of the fourth logic gate and a second electrode coupled to the data output means; and
 a fourth transistor having a first electrode receiving a second potential and control and second electrodes coupled to the first electrode of the third transistor.

13. The circuit of claim 12, wherein the first and second logic gates are respectively an NOR gate and an NAND gate, the first and second transistors are PMOS transistors, the third and fourth transistors are NMOS transistors, the third and fourth logic gates are inverters, the first electrode, the second electrode and the control electrode are a source, a drain and a gate, respectively, and wherein the first and second potentials are a supply voltage and a ground, respectively.

14. An output buffer control circuit, comprising:
 a first latch circuit inverts and latches an input data based on a first signal;
 a data output circuit that logically processes an output signal from the first latch circuit based on a second signal and generates an output data;
 a second latch circuit that inverts and latches the output signal from the first latch circuit based on the second signal;
 a signal detecting circuit that generates a predetermined width pulse based on the second signal; and
 an output terminal pre-reset circuit that logically processes the predetermined width pulse from the signal detecting circuit and an output signal from the second latch circuit to pre-reset the output data of the data output circuit.

15. The circuit of claim 14, wherein the second signal is an output control signal, and wherein the signal detecting circuit generates the predetermined width pulse when the output control signal shifts from a high level to a low level.

16. The circuit of claim 14, wherein the output data comprises a three phase signal.

* * * * *